United States Patent
Felber

(10) Patent No.: US 9,224,395 B2
(45) Date of Patent: Dec. 29, 2015

(54) VOICE DETECTION FOR AUTOMATIC VOLUME CONTROLS AND VOICE SENSORS

(76) Inventor: Franklin S. Felber, San Diego, CA (US)

(*) Notice: Subject to any disclaimer, the term of this patent is extended or adjusted under 35 U.S.C. 154(b) by 905 days.

(21) Appl. No.: 12/983,822

(22) Filed: Jan. 3, 2011

(65) Prior Publication Data

US 2012/0008802 A1 Jan. 12, 2012

Related U.S. Application Data

(63) Continuation-in-part of application No. PCT/US2008/069002, filed on Jul. 2, 2008.

(51) Int. Cl.
H04B 15/00 (2006.01)
G10L 15/22 (2006.01)

(52) U.S. Cl.
CPC ...................................... G10L 15/22 (2013.01)

(58) Field of Classification Search
USPC ............ 381/57, 83, 93, 104–108, 312, 314, 381/315, 316, 318, 71.1, 92, 94.1–94.3, 381/94.7, 95, 96; 455/92, 517; 340/5.71; 704/233
See application file for complete search history.

(56) References Cited

U.S. PATENT DOCUMENTS

| 7,248,708 | B2* | 7/2007 | Vaudrey et al. | 381/94.7 |
| 8,275,151 | B2* | 9/2012 | Caramma | 381/97 |
| 8,467,544 | B2* | 6/2013 | Inoue et al. | 381/94.1 |
| 2004/0047480 | A1 | 3/2004 | Roeck et al. | |
| 2004/0076302 | A1* | 4/2004 | Christoph | 381/57 |
| 2004/0137929 | A1* | 7/2004 | Jones et al. | 455/517 |
| 2005/0163331 | A1 | 7/2005 | Gao et al. | |
| 2007/0121979 | A1 | 5/2007 | Zhu et al. | |

FOREIGN PATENT DOCUMENTS

KR 1019990060504 7/1999

* cited by examiner

*Primary Examiner* — Vivian Chin
*Assistant Examiner* — Friedrich W Fahnert
(74) *Attorney, Agent, or Firm* — Continuum Law; Robert P. Cogan

(57) ABSTRACT

A voice detection system and method for automatic volume controls and voice sensors is disclosed. More specifically, the invention addresses a situation where the user's own voice undesirably affects the functionality of an automatic volume control for a two-way communication device, such as a cellular telephone. In addition, the invention proposes solutions wherein one (voice) microphone is employed and also, when two (voice and noise) microphones are employed. Further, an algorithm is disclosed that addresses the issue concerning the user's own voice in an AVC pertaining to the two microphone solution. Yet further, a method herein is disclosed that detects the presence of voice in a single non-selective (noise) microphone.

19 Claims, 5 Drawing Sheets

VOICE DETECTION FOR AUTOMATIC VOLUME CONTROLS AND VOICE SENSORS

RELATED APPLICATIONS

This application is a continuation-in-part application claiming priority under 35 U.S.C. 365 (c) and 37 CFR 1.53 (b) from PCT Application No. PCT/US2008/069002 filed on Jul. 2, 2008.

BACKGROUND OF THE INVENTION

1. Field of the Invention

The present invention pertains generally to the acoustical arts. More specifically, the present invention pertains to systems and methods to improve speech intelligibility in the presence of intermittent background noise. The present invention, in a preferred embodiment, is particularly but not exclusively, useful as a voice detection system and method for compensation thereof for automatic volume control devices; in addition to voice detection for remote acoustic monitors.

2. Description of the Prior Art

The automatic volume control (AVC) system and methods applicable to audio output devices such as a car radio are generally known. Similarly, AVCs for two-way communication devices, such as cellular phones are also generally known.

Cellular telephones, in particular, are often used outdoors in crowds, and in cars and other environments where the background noise fluctuates in intensity. To adjust the volume control constantly on a telephone in a noisy environment is inconvenient, and may even be impractical. For this reason, a user of a communications device such as a portable telephone could potentially benefit from an AVC feature.

The AVC for a telephone is similar to the AVC for a radio in that both should have some means of discriminating significant noise from less consequential noise. Both should also have some means of separating the significant noise from a signal that requires no compensation or different compensation. In the case of a radio, the signal that requires no compensation by an AVC is the normal audio output of the radio speakers. The AVC for a radio should have some means of separating the speaker signal from the noise background. In the case of a telephone, the signal that requires no compensation or different compensation than the noise background is the telephone user's own voice. The AVC for a telephone or other multiplexed communications device should have some means of separating the user's voice from the noise background. Accordingly, a problem arises since an AVC for a cellular phone should not adjust an amplifier gain based on the user's own voice. Also, cellular phones currently are configured with just one (voice) microphone, and therefore, a solution providing AVC for a cellular phone should consider both one (voice) microphone and two (voice and noise) microphones.

In light of the above, it is an object of the present invention to provide a solution for a system providing AVC in a two-way communication device as to how to deal with a situation wherein the user's own voice undesirably affects an AVC. It is further an object of the present invention to provide a solution that applies to a two-way device that has a single (voice) microphone; in addition to a solution that applies to a two-way device that has been configured with two microphones, namely a voice and a noise microphone. It is still further an object of the present invention to provide a method to discriminate a user's own voice from that of the background for a two-way device that employs both a voice microphone and a noise microphone.

BRIEF SUMMARY OF THE INVENTION

The present invention specifically addresses and alleviates the above mentioned deficiencies, more particularly the invention in a first aspect is a method for automatic volume control (20) to compensate for speech interference noise for an audio amplifier (53a) providing an audio signal to a speaker (54a) in a two-way voice communications device, the method comprising: transducing a combination of acoustic voice waves and ambient acoustic waves; producing a corresponding composite signal (45a) therefrom; converting the composite signal from analog to digital in an A/D converter (50a); processing of the composite signal in a digital signal processor (36a); controlling a gain (49a) of an audio amplifier directly corresponding to an output of a speaker based on the processing of the composite signal; and deactivating the signal for controlling the gain of the audio amplifier directly corresponding to an output of the speaker when a threshold voice signal amplitude is met in either of the amplifier, the A/D converter, or the digital signal processor, the signal for controlling the gain of the audio amplifier further reverting to a default value, thereby providing a solution to a problem in automatic volume control, in a two-way communication device having a single microphone, concerning a performance of the automatic volume control while a user is speaking.

Further, this particular method is characterized in that the processing the composite signal comprises a fast Fourier transform module (FFT) and a band pass filter. Also, this method includes amplifying the composite signal in a voice amplifier preceding the converting the composite signal from analog to digital in an A/D converter (50a). This method is further characterized by adjusting the gain only when noise interferes with intelligibility of speech.

In a second aspect, the invention is a method of voice discrimination in an automatic volume control (10), to identify a voice component (61) in an audio waveform (62) containing both a user's voice and a background noise (66), so that the voice component can be subtracted from the audio waveform, so that the automatic volume control is able to adjust a volume based on the background noise and not the user's voice, the method comprising: transducing acoustic waves from a user into a corresponding voice signal V(t) using a voice microphone (40); transducing acoustic ambient waves into a corresponding composite signal using a noise microphone (42), the composite signal containing both the background noise N(t) and an unknown measure of the user's voice cV(t), wherein the unknown measure is represented by an unknown proportionality constant (c); providing a first processing period, the first processing period comprising: sampling the composite signal N(t)+cV(t); repeating the sampling of the composite signal; calculating a variance in all samples in the processing period to determine if the user's voice cV(t) is a significant factor in the composite signal N(t)+cV(t); transforming the composite signal to produce a signal corresponding to an amplitude of each frequency component within a transform spectrum; identifying a dominant voice frequency (63) according to said amplitude in the transform spectrum of the composite signal; determining a line strength of said dominant voice frequency in both the noise microphones and the voice microphones; calculating the unknown proportionality constant (c) from a ratio of the line strength in the noise and voice microphones; solving for cV(t); and subtracting cV(t) from the composite signal N(t)+cV(t), determining N(t); increasing or decreasing the automatic volume control based on said determining N(t); and repeating actions of the first processing period in second and subsequent processing periods so that the automatic volume control is able to adjust a volume based on the background noise and not the user's voice.

Additionally, this method is characterized in that it comprises adding a multiple (M) of the voice signal V(t) to the composite signal N(t)+cV(t) so that the resulting waveform in the noise microphone is represented by N(t)+(c+M)V(t), in the event that the line strength in the noise microphone does not stand out prominently at the dominant voice frequency; solving for M iteratively; determining N(t); and increasing or decreasing the automatic volume control based on said determining N(t).

Still further, this method is characterized in that it comprises providing a low frequency cutoff in the transform spectrum to exclude low frequency noise such as 60 Hz alternating current to be mistaken as the dominant voice frequency.

Yet further this method comprises using a phase and amplitude correlation technique to control the automatic volume control in the event that cV(t) is much greater than N(t). Also, this method is further characterized wherein the method is able to reduce the voice component cV(t) in the composite signal to at least about 20 dB below the level of the background noise N(t) in the noise microphone; and wherein the solving for M iteratively comprises solving for M guided by values of (c) and (M) in earlier processing periods.

In a third aspect, the invention is a method of identifying (76) the presence of voice among background noise in a non-selective noise microphone (42) comprising: providing a processing period, the processing period comprising: transducing acoustic waves into a corresponding composite signal using the noise microphone; transforming the composite signal to produce a signal corresponding to an amplitude of each frequency component within a transform spectrum; examining for a presence of a prominent strongest line above a low frequency cutoff in the transforming of the noise waveform, wherein the presence of a prominent strongest line above a low frequency cutoff indicates a presence of voice in the noise microphone; and repeating the transducing, transforming and examining during second and subsequent processing periods. Afterward, the method further comprises communicating the presence of voice in the noise microphone to an operator when the prominent strongest line appears in a succession of processing periods.

This method is further characterized wherein the prominent strongest line is deemed sufficiently prominent when the strongest line stands out at least about 10 dB above neighboring frequency components in a frequency spectrum, and wherein the method works on a principle in that during a single processing period, which is much shorter than a duration of a single spoken syllable, a voice has a dominant frequency in a bandwidth that is much narrower than a frequency range of the background noise.

The method of identifying the presence of voice in a non-selective noise microphone is further characterized wherein the succession of processing periods comprises approximately three (3) processing periods. Further, the method comprises transmitting an acoustic signal corresponding to the acoustic waves to a voice detection monitor (81) when the prominent strongest line appears in the succession of processing periods and wherein the transmitting continues for a latency period even if the prominent strongest line immediately thereafter ceases to appear, and wherein the latency period is approximately three (3) seconds.

In yet a fourth aspect, the invention is an automatic volume control system (20) to compensate for speech interference noise for an audio amplifier (53a) providing an audio signal to one or more speakers in a two-way voice communications device, the system comprising: a voice microphone (40a) for transducing acoustic voice waves from a user for producing a corresponding voice signal, the voice microphone further configured for transducing ambient acoustic waves and in response for producing a corresponding composite signal; a voice amplifier (44a) for increasing the amplitude of the voice signal and the composite signal (45a); an A/D converter (50a) for converting the voice signal and the composite signal from analog to digital; a digital signal processor (36a) including a transform process, a bandpass filter process, a speech interference process, and a solver process to produce according to an algorithm a signal (49a) for controlling a gain of an audio amplifier (53a) directly corresponding to an output of a speaker (54a); and a threshold switch for deactivating the signal for controlling the gain of the audio amplifier directly corresponding to an output of the speaker when a threshold voice signal amplitude is met in either of the voice amplifier, the A/D converter, or the digital signal processor, the signal for controlling the gain of the audio amplifier further reverting to a default value, thereby providing a solution to a problem in automatic volume control, in a two-way communication device having a single microphone, concerning a performance of the automatic volume control while a user is speaking.

The automatic volume control system according to a preferred embodiment is further characterized in that the transform process comprises a processing period in addition to a signal corresponding to the amplitude of each frequency component of the difference signal within the spectrum of said transform process. The transform process is further characterized in that is comprises a fast Fourier transform (FFT) module.

The AVC is additionally characterized in that is has a processing period and wherein when a threshold voice signal amplitude is met in either of the voice amplifier, the A/D converter, or the digital signal processor, the signal for controlling the gain of the audio amplifier further reverting to the gain for a previous processing period. Still further the AVC further comprises a phase correlator process for phase correlating the voice and composite signals; and an amplitude correlator process for amplitude correlating the phase correlated voice and composite signals, wherein the subtraction process produces a signal corresponding to a difference between the phase and amplitude correlated voice and composite signals.

While the apparatus and method has or will be described for the sake of grammatical fluidity with functional explanations, it is to be expressly understood that the claims, unless expressly formulated under 35 USC 112, or similar applicable law, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 USC 112 are to be accorded full statutory equivalents under 35 USC 112, or similar applicable law. The invention can be better visualized by turning now to the following drawings wherein like elements are referenced by like numerals.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DETAILED DESCRIPTION OF THE PREFERRED EMBODIMENTS

Figure 1:
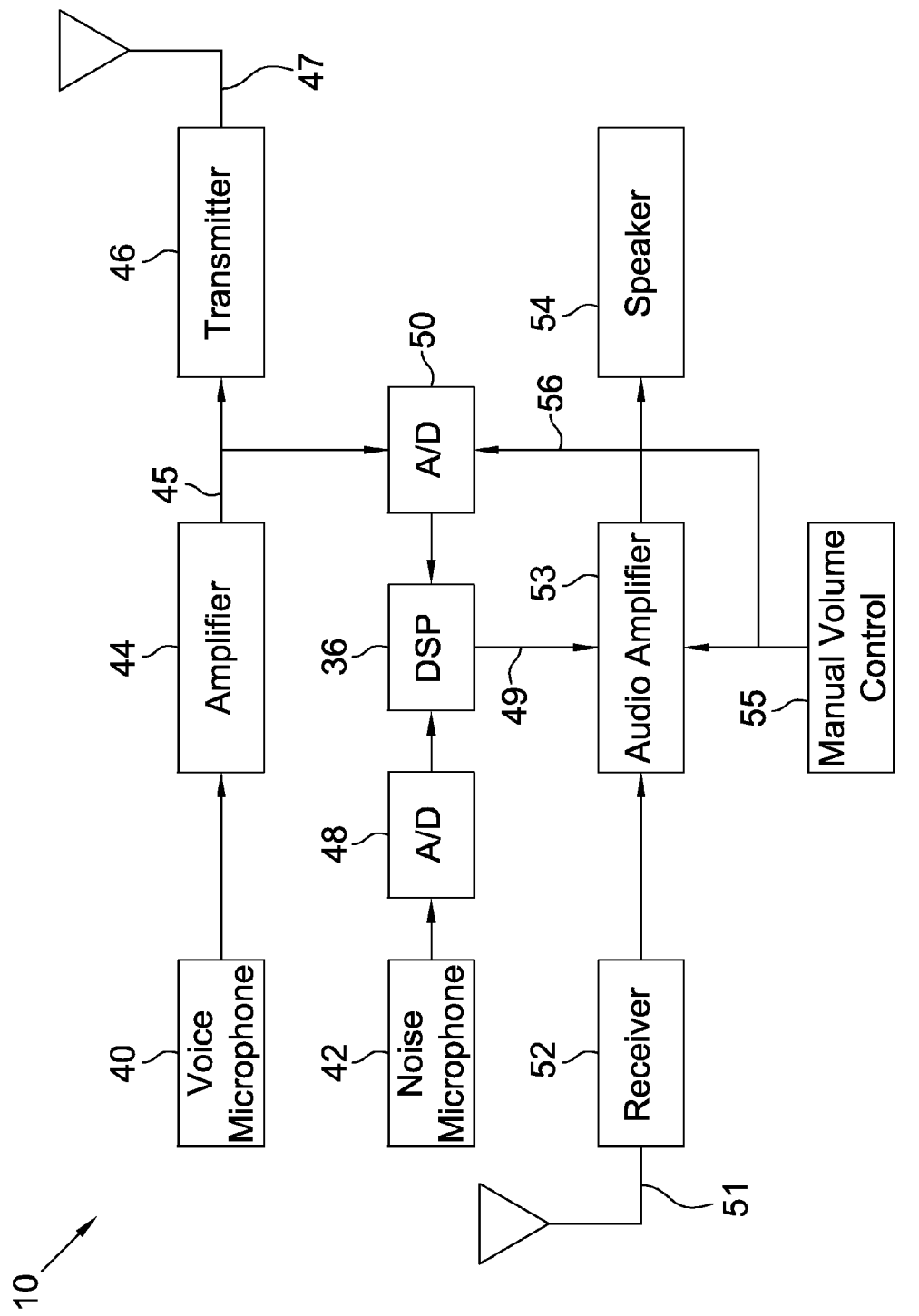
FIG. 1 is functional block diagram of a two-way communication device incorporating a separate noise microphone for automatic volume control.

Referring initially to FIG. 1 a functional block diagram of an automatic volume control 10 (AVC) for a two-way communications device, such as a cellular telephone, configured with an extra noise microphone is illustrated. The AVC 10 provides a means for distinguishing and separating from background noise the voice of a user. In this embodiment, the communications device contains at least two microphones or two microphone processes, a voice microphone 40 that selectively transduces a user's voice acoustical waves and a noise microphone 42 that non-selectively transduces ambient acoustical waves. The term "selective voice microphone" refers to a unidirectional microphone or microphone process that selectively receives a voice signal from a relatively narrow solid angle in the direction of the user's voice, or to a microphone or microphone process with a low-gain amplifier that selectively receives a signal from close to the communications device, or to a microphone or microphone process that includes both unidirectional and low-gain characteristics.

By design and disposition, a selective voice microphone 40 primarily captures the voice signal of a user, and rejects most of the background noise from directions other than that of the user's voice or from sound levels lower at the voice microphone than that of the user's voice. The term "non-selective noise microphone" refers to a microphone or microphone process that is more nearly omni-directional, or has an amplifier with higher gain, or both, for detecting all acoustical waves incident on the two-way voice communications device. The non-selective noise microphone is preferably located on a part of the communications device not directly facing the user's voice.

The selective voice microphone 40 primarily captures and communicates a signal to the AVC 10 of FIG. 1 with little noise. Conversely, non-selective noise microphone 42 captures and communicates a signal to the AVC 10 with the full noise background. An electrical signal from the selective voice microphone 40 is communicated to an amplifier 44 the output 45 of which is communicated conventionally to a transmitter 46 that feeds an antenna 47 for sending the voice signal to a remote receiver. The output of amplifier 44 is also communicated to an analog-to-digital (A/D) converter 50, wherein an analog signal is converted to a corresponding digital signal that is communicated to a digital signal processor (DSP) 36. An electrical signal from the non-selective noise microphone 42 is communicated to an A/D converter 48, wherein the analog signal is converted to a corresponding digital signal that is communicated to the DSP 36. The digitized signals of the voice and noise microphones are then correlated and processed by the DSP 36. DSP 36 comprises for example, phase and amplitude correlation modules, a Fast Fourier Transform module (FFT), bandpass filters, a speech-interference noise level calculator, and a solver. An output of the DSP 36, is an automatic volume control signal 49 from a solver and its constraints. A signal 51 received via an antenna and fed to a receiver 52 is amplified by the audio amplifier 53 before driving a speaker 54. Conventionally the gain of the audio amplifier 53 is controlled by a manual volume control 55.

The volume control signal 49 from the DSP 36 also adjusts the gain of the audio amplifier. Constraints are applied as inputs to the solver within the DSP 36. Anytime the manual volume control 55 is used to adjust the gain of the audio amplifier 53, the adjusted gain is sent as an input 56 to the constraint process within the DSP 36 via the A/D converter 50. The constraint process updates constraint parameters sent to the solver.

Figure 2:
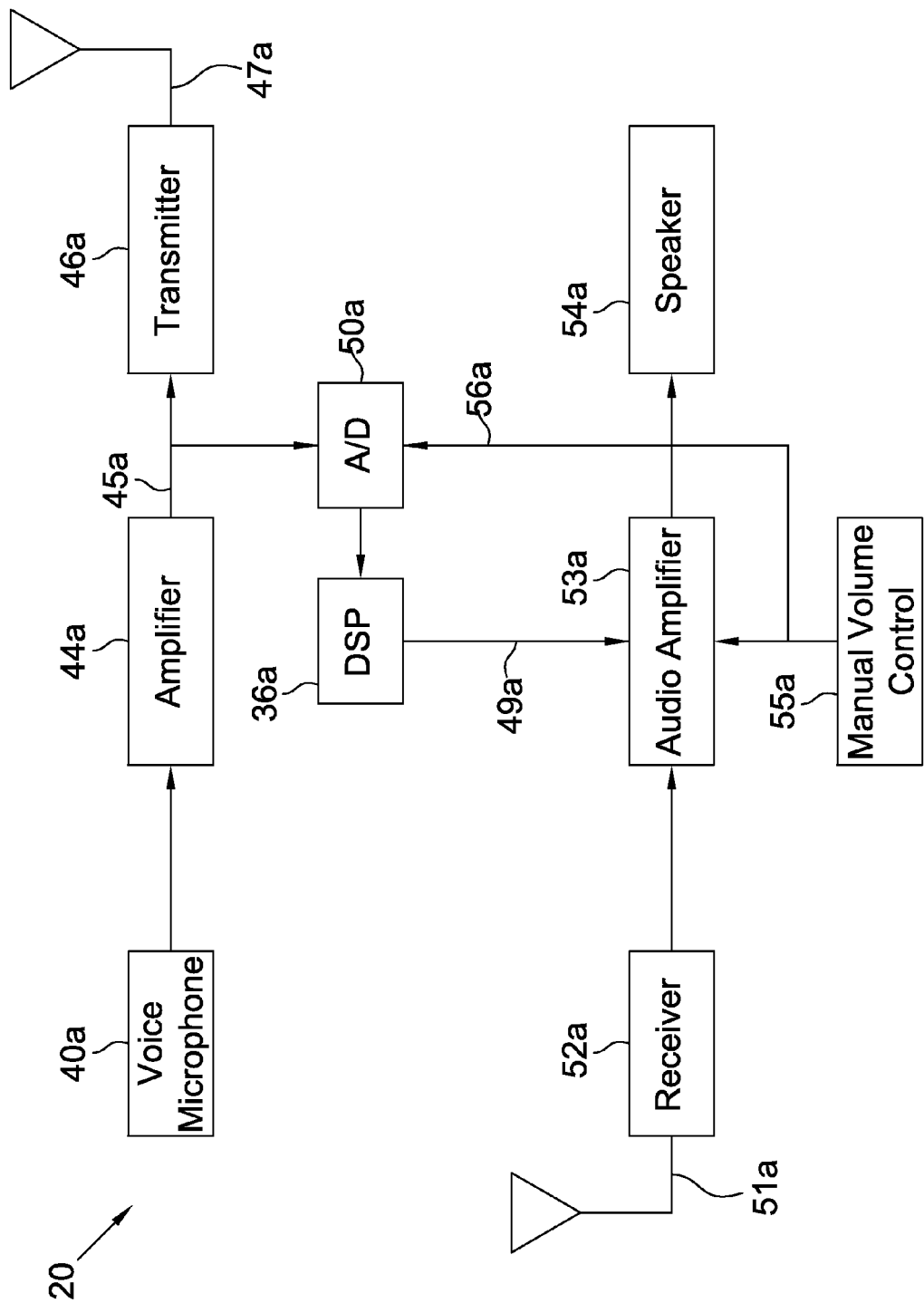
FIG. 2 is a functional block diagram of a two-way communication device illustrating a one microphone solution according to the present invention.

Referring to FIG. 2, an alternative embodiment 20 to that shown in FIG. 1 is to combine the noise microphone 42 or microphone process with the voice microphone 40 or microphone process as a single microphone or microphone process 40a. A primary advantage of the embodiment utilizing only one microphone 40a or microphone process is that a communications platform requires little or no additional hardware to implement an AVC 20. Consequently, an AVC 20 requiring only one microphone is easier and less costly to implement. A primary disadvantage of the one-microphone embodiment is that the SIL calculated within the DSP 36a will not, in general, accurately characterize the noise background actually heard by the user. Voice microphones 40a on communications devices, such as cellular telephones, generally have high directivity and low gain purposely to exclude much of the noise background. A noise microphone 42 specifically designed to characterize the noise background accurately would generally have lower directivity and higher gain than an optimal voice microphone 40a.

As a primary objective of the present invention, a solution is needed as to how the system and methods herein deal with problem of the AVC 10, 20 adjusting audio gain 53, 53a in response to the user's own voice. Accordingly, the AVC 10, 20 for a cellular telephone or other multiplexed communications device should have some means of separating the user's voice from the noise background. Otherwise, the AVC 10, 20 may respond to the user's voice by inappropriately increasing the gain control signal 49, 49a as though the user's voice were just another source of background noise. Two approaches to discriminating the user's voice from background noise are described herein below.

A first, simpler method for an AVC 20 to accommodate a user's voice is to deactivate the AVC 20 during each processing period in which the user is speaking into the selective voice microphone 40a. In the preferred embodiment of this method, a signal from the voice microphone 40a that exceeds a threshold amplitude during any processing period, either in the amplifier 44a or the A/D converter 50a or the DSP 36a, causes the AVC control signal 49a to no longer compensate for the signal from the microphone 40a during that processing period. Instead, during each processing period in which the amplitude threshold is exceeded, the AVC 20 control signal 49a would either remain the same as it was during an earlier processing period or combination of processing periods in which the threshold was not exceeded, or it would revert to some default value.

A primary advantage for an AVC 20 of this approach to accommodate a user's voice is that it is a simple and robust method with a high probability of user-voice detection and low probability of false threshold exceedance. A primary disadvantage of this approach is that much of the benefit of an AVC 20 is lost while the user is speaking.

Further to FIG. 2, an output 45a of an amplifier 44a is communicated conventionally to a transmitter 46a the feeds an antenna 47a for sending the voice signal to a remote receiver. Also similarly, a signal 51a is received via an antenna and fed to a receiver 52a and is amplified by the audio amplifier 53a before driving a speaker 54a. In normal operation, gain of the audio amplifier 53a is controlled by manual volume control 55a. As in the two microphone system 10, anytime the manual volume control is used to adjust the gain of the audio amplifier 53a, the adjusted gain is sent as an input 56a to the constraint process within the DSP 36 via the A/D converter 50.

For applications or implementations of an AVC 20 in which it is desirable or necessary for the AVC 20 to operate even while the user is speaking, a following second approach to discriminating the user's voice from background noise may be preferred employing a second noise microphone 42 (FIG. 1).

The greatest challenge to discriminating a user's voice from background noise with certain communications devices, such as portable telephones, is that a position, distance, and orientation of the voice microphone 40 may be changing with respect to a user's voice as the user is speaking. By contrast, in a one way communication device such as a car radio, for example, the audio output of the speakers bears an effectively constant relationship in phase and amplitude to the audio input into the microphone. The phase and amplitude correlation techniques that discriminate an audio signal from background noise in an audio receiving device, therefore, are not directly applicable to two-way communications devices.

A primary objective of a voice-discrimination algorithm of the present invention is to identify the voice component of an audio (voltage) waveform containing both a user's voice and background noise, so that the voice component can be subtracted from the waveform, leaving only background noise to be processed by an AVC 10. The algorithm is applicable to systems in which a voice microphone 40 or microphone process collects primarily a voice waveform $V(t)$, and a noise microphone 42 or noise microphone process collects a linear combination of a noise waveform $N(t)$ and some unknown measure of the voice waveform $cV(t)$. That is, since the noise microphone 42 is omnidirectional and high gain, the waveform collected by the noise microphone is $N(t)+cV(t)$, where c is some unknown proportionality factor to be determined by the algorithm. Since the voice microphone 40 is directional and low gain, it is assumed to a good approximation to collect only the voice waveform $V(t)$ and none of the background noise.

The proportionality factor c depends on the position, distance, and orientation of the voice microphone 40 with respect to a user's voice, as well as many other factors, and in general will change with time. During a single processing period, however, which may last no longer than about 25 ms, the value of c will change very little, and may be considered constant. The algorithm determines a new value of c every processing period.

No matter how big or small $cV(t)$ may be with respect to $N(t)$ in the noise microphone 42, the algorithm is capable of determining c and reducing the residual voice from the noise microphone 42 to a level at least about 20 dB below the level of background noise. If $cV(t)$ is much greater than $N(t)$, then the waveforms in the noise and voice microphones 40, 42 look nearly alike, and $cV(t)$ in the noise microphone is easily correlated in phase and amplitude with the waveform $V(t)$ in the voice microphone 42, and in such a case c can be determined by a phase correlator and amplitude correlator in the DSP 36. If the level of $cV(t)$ is at least 20 dB below $N(t)$, then c does not need to be determined, because $cV(t)$ is of negligible consequence in the operation of the AVC. The algorithm is really only needed to determine c, therefore, when the ratio of voice level to noise level in the noise microphone is about from −20 dB to +20 dB.

Figure 3A:
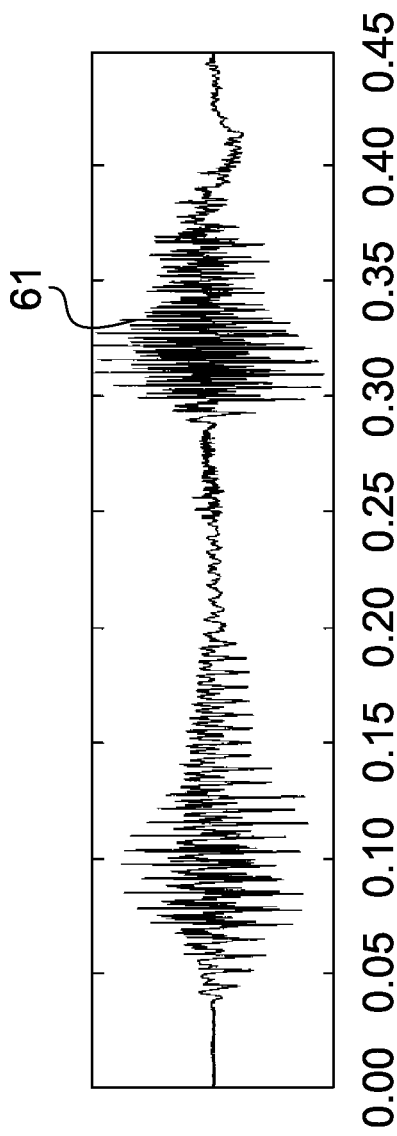
FIG. 3A is an exemplary representation of an audio voltage waveform in a voice microphone.
Figure 3B:
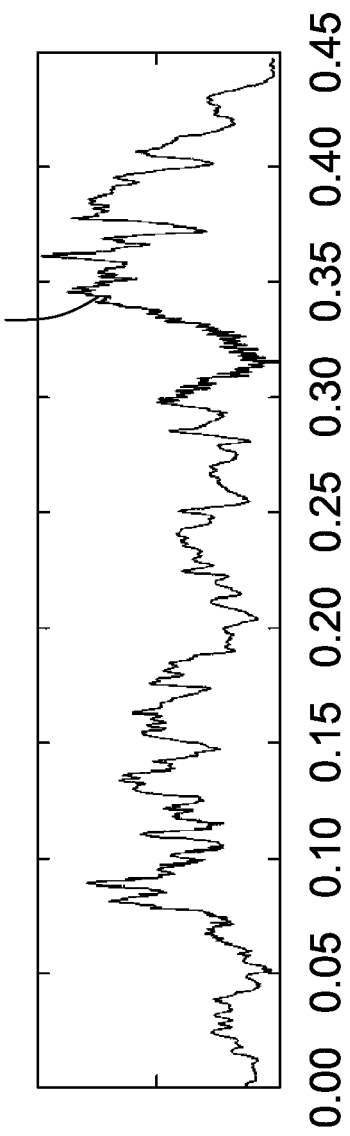
FIG. 3B is an exemplary waveform of a voltage waveform in a noise microphone having sound components of both background noise and a user's voice, N(t)+cV(t)
Figure 3C:
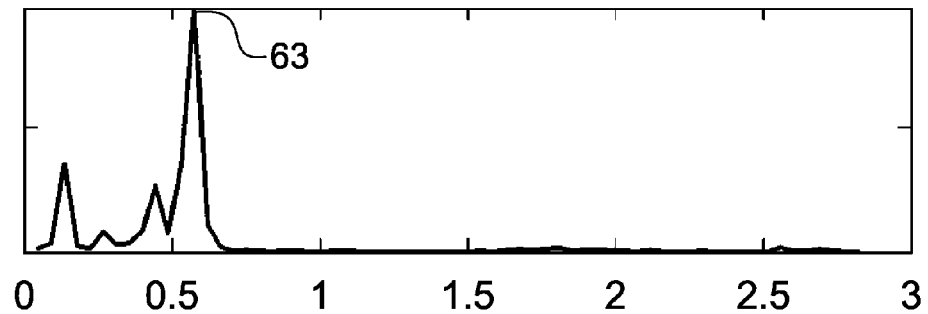
FIG. 3C is a plot of a power spectral density vs. frequency (in kHz) in one processing period with a strongest line evident.
Figure 3D:
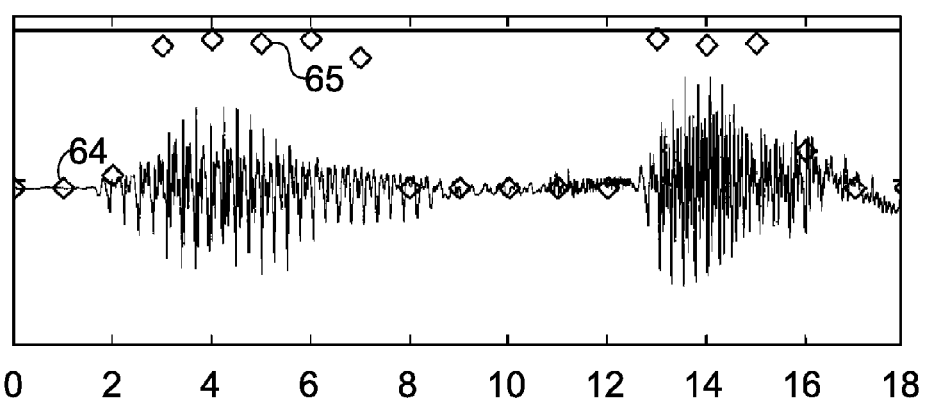
FIG. 3D illustrates an application of a voice-discrimination algorithm of the present invention over eighteen (18) processing periods.
Figure 3E:
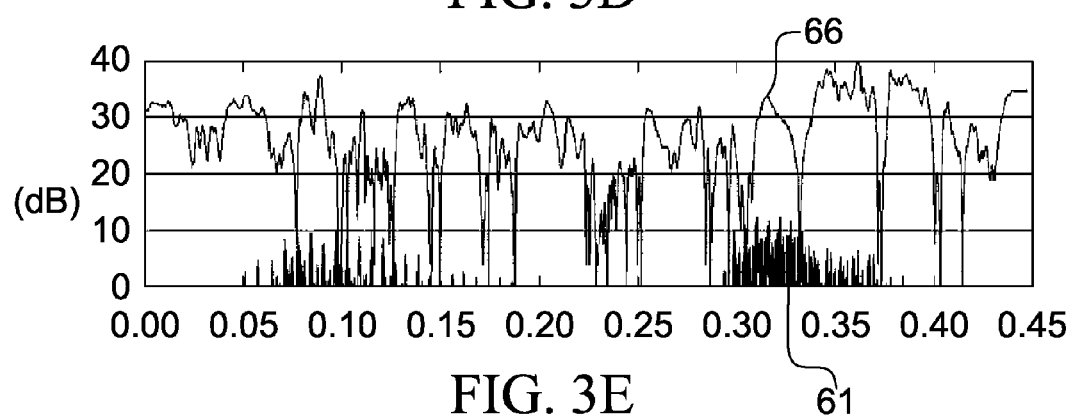
FIG. 3E illustrates the residual voice level in the noise microphone and the left over noise component subsequent to minimizing the effect of the voice level on a logarithmic scale (dB)

The voice-discrimination algorithm of the present invention is described in reference to the example shown in FIG. 3A through 3E. FIG. 3A shows a voice waveform $V(t)$ vs. time in seconds. This voice waveform 61, with some proportionality factor c, is "concealed" in the noise-microphone 42 waveform $N(t)+cV(t)$ in the voltage waveform 62 illustrated in FIG. 3B. FIG. 3C illustrates a power spectral density vs. frequency in kHz of the waveform in FIG. 3B during one particular processing period, the $15^{th}$ (according to FIG. 3D). The voice-discrimination algorithm is applied in each of the eighteen (18) processing periods in FIG. 3D. Further, FIG. 3E shows that after application of the voice discrimination algorithm and subtraction of the voice, the residual voice waveform remaining in the noise microphone signal is reduced to a level about 20 dB below the background noise, whereas at first it was comparable to the background noise.

The algorithm works based on two principles. The first is that during a single processing period, which is much shorter than the duration of a single spoken syllable, a voice has a dominant frequency in a band that is much narrower than the frequency range of the background noise. The second principle is that c changes little from one processing period to the next, because the user does not move much relative to the communications device during such a short time.

The voice-discrimination algorithm works the following way in each processing period. First, the DSP 36 calculates, from the signal of the voice microphone 40, a variance of all the samples in a processing period as a measure of statistical dispersion. If the variance is below a threshold, then the user's voice is considered negligible or absent during that processing period, and no effort is made to subtract voice from noise in the noise microphone during that processing period. In FIG. 3D, a determination of c in eighteen (18) processing periods is illustrated. Diamond points 64 that lie on a zero line represent processing periods in which the voice is negligible or absent. The proximity of the diamond points 65 to a line illustrated above indicate the accuracy of the determination of c in each processing period. That is, the closer the diamond points 65 to the line above indicate the accuracy of the algorithm of the present invention. As shown, whenever the voice is loud enough to matter, the algorithm is accurate.

Second and referring to FIG. 3C, from the absolute value of the FFT spectrum above a certain low frequency cutoff, the frequency of a strongest line 63 is identified. The cutoff frequency of the FFT spectrum might be about 100 Hz to 200 Hz, for example, to accommodate deep voices, but exclude low-frequency noise sources, such as 60-Hz alternating currents.

The strongest line 63 above the low frequency cutoff in the FFT of the voice waveform is considered to be the dominant voice frequency during the processing period. A third step is to examine the absolute value of the FFT spectrum of $N(t)+cV(t)$ in the noise microphone 42 in the same processing period. If the line strength at the dominant voice frequency stands out prominently in the spectrum, particularly with respect to neighboring frequency components, then the ratio of line strengths in the voice microphone 40 and noise microphone 42 at the dominant voice frequency is used to determine c in that processing period. The line strength at the dominant voice frequency might be considered to stand out prominently in the FFT of the noise microphone 42 if it is at least 10 dB above the neighboring spectrum.

In general, the line 63 at the dominant voice frequency may not stand out prominently in the spectrum of $N(t)+cV(t)$. In that case, an additional method step is to add some multiple M of the voice waveform $V(t)$ to the waveform in the noise microphone 42, so that the resulting waveform 62 in the noise microphone 42 becomes $N(t)+(c+M)V(t)$. The object is to choose M large enough so that the line at the dominant voice frequency stands out prominently in the FFT of $N(t)+(c+M)V(t)$, but not so large that the voice component overwhelms the noise background. Accuracy in determining c suffers if the line in the noise microphone 42 at the dominant voice frequency is not prominent enough or if it is too strong. The optimal choice of the multiplier M can be found iteratively or can be guided by values of c and M in earlier processing periods.

Once c and M are determined for a processing period, then $(c+M)V(t)$ is subtracted from the signal in the noise microphone 42, leaving only the noise background $N(t)$ with no more than about 1 percent of that noise level being the residual of the user's voice. The noise background $N(t)$ is then processed by the AVC functions of the DSP 36.

Figure 4:
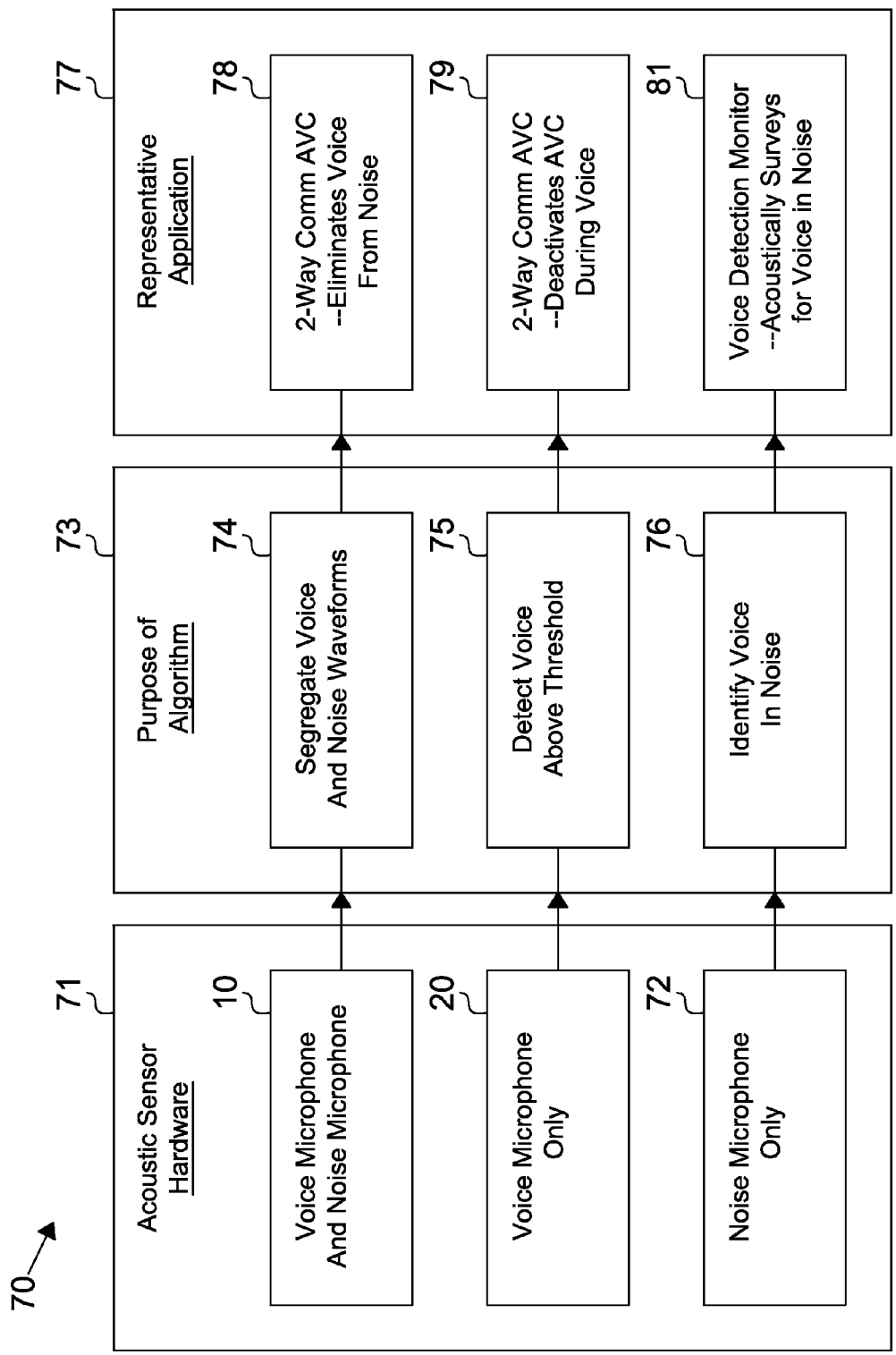
FIG. 4 is a functional block diagram illustrating three (3) primary embodiments of the present invention.

The method described herein for distinguishing a voice from background noise has wider applicability than just in two-way communications devices. FIG. 4 is a functional block diagram 70 showing how a selective voice microphone system 20 and non-selective noise microphone system 72 can be used together 10 or separately 20, 72 with different algorithm embodiments for different applications 77.

With reference to FIG. 4, a voice microphone and noise microphone system 10 can be used together with the algorithm and methods described herein to segregate voice 61 and noise waveforms 66. Once the voice waveform is segregated 74 from the noise and separately characterized in phase and amplitude, the voice waveform 61 can be subtracted from the combined waveform of voice plus noise 62, in order to characterize the noise background 66 accurately. The accurate elimination 78 of voice 61 from a noise background 66 allows an accurate response of an AVC 10 to the noise background alone 66, and can eliminate the response of an AVC to the user's voice 61.

Also, a voice and noise microphone system 10 can be used with algorithms presented herein to perform simpler functions 73 that can be performed with either microphone alone, but to do so more accurately. FIG. 4 indicates functions 73 that can be performed by either the voice microphone system 20 alone or the noise microphone system 72 alone, and that can be performed more accurately by both microphones operating together 10. Also illustrated are representative applications 77 for the different combinations of hardware 71.

As previously stated, the voice microphone alone 20 can be used with the algorithm and methods described herein to detect 75 the presence of a user's voice 61 above a threshold level. During all periods in which a user's voice 61 exceeds a threshold level, an AVC 20 can be deactivated 79 to eliminate a response of the AVC 20 to the user's voice.

In yet another embodiment of the present invention, a noise microphone can be used alone 72 with a variation of the algorithm and methods described herein to discriminate a voice from a noise background 76. The application might be any acoustic surveillance system 81 that monitors continuously or intermittently for a human voice 61 appearing in background noise 66. Examples of such applications include a passive acoustic baby monitor, or a passive acoustic intrusion detection system, which operate in noisy environments, and only provide alerts or transmit acoustic signals when voices are sensed.

Such an acoustic voice detection monitor 81 can operate with a non-selective, omni-directional noise microphone 42 alone. The processing is similar to that of the algorithm that segregates voice 61 and noise waveforms 66 for an AVC 10. But in this case, no separate voice waveform 61 is available through use of a voice microphone 40 as a template or benchmark for purposes of extracting the voice waveform 61 from the noise background 66. Instead, the processing for a voice detection monitor 81 proceeds as follows.

During every processing period, the spectrum of the noise waveform 62 is examined for the presence of a prominent strongest line above the low frequency cutoff in the FFT of the noise waveform, similar to the strongest line 63 in FIG. 3C. As described with reference to FIG. 3C, the line strength might be considered to stand out prominently in the FFT of the noise microphone 42 if it is at least 10 dB above the neighboring spectrum. The algorithm for the voice detection monitor is based on the principle, presented herein, "that during a single processing period, which is much shorter than the duration of a single spoken syllable, a voice has a dominant frequency in a bandwidth that is much narrower than the frequency range of the background noise."

The presence of such a prominent spectral spike, like line 63, provides notice that a voice 61 may be present during that processing period. Since a processing period is much shorter than the duration of a single spoken syllable, subsequent processing periods are examined for spectral spikes as confirmation of the presence of a voice. Once a voice 61 is confirmed by this method, then the voice detection monitor 81 may provide an alert or transmit an acoustic signal of the voice to an operator. If the occurrence of a spectral spike 63 in one processing period is not followed by confirmation of the presence of a voice in subsequent periods, then no alert or acoustic signal need be transmitted to the operator.

Since only one microphone, a non-selective noise microphone 72, is available in this embodiment of a voice detection monitor, the DSP might not segregate a confirmed voice from noise before transmittal to an operator. Even if the average noise level is much higher than the average voice level, any voice detected by this method of a prominent spectral line 63 is likely to be discernible and intelligible above the background noise even without being extracted from the noise. And even if the voice is unintelligible, for many applications 81, such as a baby monitor or intrusion detector, the presence of the voice may be more significant than its comprehensibility.

Once a voice 61 is confirmed by spectral spikes 63 in a succession of processing periods, the transmission of the acoustic signal, if any, should be continued for a latency period that might be of the order of a few seconds. The transmission should not be terminated immediately upon pausing or cessation of the voice 61, as that would lead to 'choppiness' in the transmitted signal.

Many alterations and modifications may be made by those having ordinary skill in the art without departing from the spirit and scope of the invention. Therefore, it must be understood that the illustrated embodiments have been set forth only for the purposes of example and that it should not be taken as limiting the invention as defined by the following claims. For example, notwithstanding the fact that the elements of a claim are set forth below in a certain combination, it must be expressly understood that the invention includes other combinations of fewer, more or different elements, which are disclosed above even when not initially claimed in such combinations.

While the particular Voice Detection for Automatic Volume Controls and Voice Sensors as herein shown and disclosed in detail is fully capable of obtaining the objects and providing the advantages herein before stated, it is to be understood that it is merely illustrative of the presently preferred embodiments of the invention and that no limitations are intended to the details of construction or design herein shown other than as described in the appended claims.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

What is claimed is:

1. A method of voice discrimination in an automatic volume control, to identify a voice component in an audio waveform containing both a user's voice and a background noise, so that the voice component can be subtracted from the audio waveform, so that the automatic volume control is able to adjust a volume based on the background noise and not the user's voice, the method comprising:

transducing acoustic waves from a user into a corresponding voice signal $V(t)$ using a voice microphone;

transducing acoustic ambient waves into a corresponding composite signal using a noise microphone, the composite signal containing both the background noise $N(t)$ and an unknown measure of the user's voice $cV(t)$, wherein the unknown measure is represented by an unknown proportionality constant $c$;

providing a first processing period, the first processing period comprising: sampling the composite signal $N(t)+cV(t)$;

repeating the sampling of the composite signal;

calculating a variance in all samples in the processing period to determine if the user's voice $cV(t)$ is a significant factor in the composite signal $N(t)+cV(t)$;

transforming the composite signal to produce a signal corresponding to an amplitude of each frequency component within a transform spectrum;

identifying a dominant voice frequency according to said amplitude in the transform spectrum of the composite signal;

determining a line strength of said dominant voice frequency in both the noise microphones and the voice microphones;

calculating the unknown proportionality constant $c$ from a ratio of the line strength in the noise and voice microphones;

solving for $cV(t)$; and subtracting $cV(t)$ from the composite signal $N(t)+cV(t)$, determining $N(t)$; increasing or decreasing the automatic volume control based on said determining $N(t)$; and repeating actions of the first processing period in second and subsequent processing periods so that the automatic volume control is able to adjust a volume based on the background noise and not the user's voice.

2. The method of voice discrimination in an automatic volume control of claim 1, further comprising:

adding a multiple $M$ of the voice signal $V(t)$ to the composite signal $N(t)+cV(t)$ so that the resulting waveform in the noise microphone is represented by $N(t)+(c+M)V(t)$, in the event that the line strength in the noise microphone does not stand out prominently at the dominant voice frequency;

solving for $M$ iteratively;

determining $N(t)$; and increasing or decreasing the automatic volume control based on said determining $N(t)$.

3. The method of voice discrimination in an automatic volume control of claim 1, further comprising providing a low frequency cutoff in the transform spectrum to exclude low frequency noise such as 60 Hz alternating current to be mistaken as the dominant voice frequency.

4. The method of voice discrimination in an automatic volume control of claim 1, further comprising using a phase and amplitude correlation technique to control the automatic volume control in the event that $cV(t)$ is much greater than $N(t)$.

5. The method of voice discrimination in an automatic volume control of claim 1 wherein the method is able to reduce the voice component $cV(t)$ in the composite signal to at least about 20 dB below the level of the background noise $N(t)$ in the noise microphone.

6. The method of voice discrimination in an automatic volume control of claim 2 wherein the solving for $M$ iteratively comprises solving for $M$ guided by values of $c$ and $M$ in earlier processing periods.

7. A method of identifying the presence of voice among background noise in a non-selective noise microphone comprising:

providing a processing period comprising:

transducing acoustic waves into a corresponding composite signal using the noise microphone;

transforming the composite signal to produce a signal corresponding to an amplitude of each frequency component within a transform spectrum;

examining for a presence of a prominent strongest line above a low frequency cutoff in the transforming of the noise waveform, wherein the presence of a prominent strongest line above a low frequency cutoff indicates a presence of voice in the noise microphone; and repeating the transducing, transforming and examining during second and subsequent processing periods; and communicating the presence of voice in the noise microphone to an operator when the prominent strongest line appears in a succession of processing periods.

8. The method of identifying the presence of voice in a non-selective noise microphone of claim 7 wherein the prominent strongest line is deemed sufficiently prominent when the strongest line stands out at least about 10 dB above neighboring frequency components in a frequency spectrum, and wherein the method works on a principle in that during a single processing period, which is much shorter than a duration of a single spoken syllable, a voice has a dominant frequency in a bandwidth that is much narrower than a frequency range of the background noise.

9. The method of identifying the presence of voice in a non-selective noise microphone of claim 7 wherein the succession of processing periods comprises approximately 3 processing periods.

10. The method of identifying the presence of voice in a non-selective noise microphone of claim 7 further comprising transmitting an acoustic signal corresponding to the acoustic waves to a voice detection monitor when the prominent strongest line appears in the succession of processing periods and wherein the transmitting continues for a latency period even if the prominent strongest line immediately thereafter ceases to appear, and wherein the latency period is approximately 3 seconds.

11. An automatic volume control system to compensate for speech interference noise for an audio amplifier providing an audio signal to one or more speakers in a two-way voice communications device, the system comprising:
 a voice microphone for transducing acoustic voice waves from a user for producing a corresponding voice signal, the voice microphone further configured for transducing ambient acoustic waves and in response for producing a corresponding composite signal;
 a voice amplifier for increasing the amplitude of the voice signal and the composite signal;
 an A/D converter for converting the voice signal and the composite signal from analog to digital;
 a digital signal processor including a transform process, a bandpass filter process, a speech interference process, and a solver process to produce according to an algorithm a signal for controlling a gain of an audio amplifier directly corresponding to an output of a speaker; and
 a threshold switch for deactivating the signal for controlling the gain of the audio amplifier directly corresponding to an output of the speaker when a threshold voice signal amplitude is met in either of the voice amplifier, the A/D converter, or the digital signal processor, the signal for controlling the gain of the audio amplifier further reverting to a default value, thereby providing
 a solution to a problem in automatic volume control, in a two-way communication device having a single microphone, concerning a performance of the automatic volume control while a user is speaking.

12. The automatic volume control system of claim 11, the transform process comprising a processing period and a signal corresponding to the amplitude of each frequency component of the difference signal within the spectrum of said transform process.

13. The automatic volume control system of claim 11, the transform process further comprising a fast Fourier transform module.

14. The automatic volume control system of claim 11, further comprising a processing period and wherein when a threshold voice signal amplitude is met in either of the voice amplifier, the A/D converter, or the digital signal processor, the signal for controlling the gain of the audio amplifier further reverting to the gain for a previous processing period.

15. The automatic volume control system of claim 11, further comprising:
 a phase correlator process for phase correlating the voice and composite signals; and an amplitude correlator process for amplitude correlating the phase correlated voice and composite signals, wherein the subtraction process produces a signal corresponding to a difference between the phase and amplitude correlated voice and composite signals.

16. A method for selective automatic volume control to compensate for speech interference noise received by a transducer coupled to an audio amplifier providing an audio signal to an output transducer, the method comprising:
 providing a sound transducer and producing a composite signal indicative of acoustic voice waves and ambient acoustic waves received by the transducer;
 producing a transform of the composite signal, the transform comprising a signal indicative of an amplitude of each frequency component within a transform spectrum;
 processing the transform to resolve the composite signal into first and second components indicative of acoustic voice waves and ambient acoustic waves respectively;
 producing a gain control signal controlling gain of the audio amplifier in correspondence with the ambient acoustic wave component;
 establishing a preselected threshold value corresponding to a level of the acoustic voice wave component; and
 deactivating updating of the gain control signal when the acoustic voice wave component exceeds the preselected threshold.

17. The method for selective automatic volume control of claim 16 wherein the step of producing the transform comprises producing a Fast Fourier Transform.

18. The method for selective automatic volume control of claim 17 further comprising converting the composite signal from analog to digital in an A/D converter prior to producing the transform.

19. The method for selective automatic volume control of claim 18 further comprising applying controlling the gain control signal in accordance with a calculation of intelligibility.

* * * * *